(12) United States Patent
Cheah et al.

(10) Patent No.: US 7,319,051 B2
(45) Date of Patent: Jan. 15, 2008

(54) THERMALLY ENHANCED METAL CAPPED BGA PACKAGE

(75) Inventors: Eng C. Cheah, San Jose, CA (US); Donald S. Fritz, San Jose, CA (US)

(73) Assignee: Altera Corporation, San Jose, CA (US)

( * ) Notice: Subject to any disclaimer, the term of this patent is extended or adjusted under 35 U.S.C. 154(b) by 245 days.

(21) Appl. No.: 11/075,102

(22) Filed: Mar. 8, 2005

(65) Prior Publication Data

US 2005/0179125 A1 Aug. 18, 2005

Related U.S. Application Data

(62) Division of application No. 10/068,523, filed on Feb. 5, 2002, now Pat. No. 6,882,041.

(51) Int. Cl.
*H01L 21/44* (2006.01)
(52) U.S. Cl. .............................. 438/122; 257/E23.092
(58) Field of Classification Search .................... 438/6, 438/10, 104, 107–114, 118, 121–123, 128–129, 438/135, 142, 145, 149, 151, 157, 176, 478, 438/184, 193, 195–198, 200–203, 206–207, 438/209–211, 218, 237, 165, 294, 308, 337, 438/353
See application file for complete search history.

(56) References Cited

U.S. PATENT DOCUMENTS

| | | | | |
|---|---|---|---|---|
| 6,081,997 A | * | 7/2000 | Chia et al. | 29/841 |
| 6,379,997 B1 | * | 4/2002 | Kawahara et al. | 438/106 |
| 6,552,263 B2 | * | 4/2003 | Farquhar et al. | 174/521 |
| 6,821,819 B1 | * | 11/2004 | Benavides et al. | 438/122 |
| 2004/0043539 A1 | * | 3/2004 | Lee et al. | 438/122 |
| 2005/0186704 A1 | * | 8/2005 | Yee et al. | 438/106 |

* cited by examiner

*Primary Examiner*—Michael Lebentritt
*Assistant Examiner*—Andre' Stevenson
(74) *Attorney, Agent, or Firm*—Morgan, Lewis & Bockius LLP

(57) ABSTRACT

A thermally enhanced wirebond BGA package having a laminate substrate, an IC device mounted on the substrate, and a metal cap defining a cavity inside the package between the IC device and the metal cap. A substantial portion of the cavity is filled with a thermally enhanced epoxy encapsulant establishing a thermal conduction path between the IC device and the metal cap. The BGA package may be further enhanced by bonding a metal heat slug on the laminate substrate and mounting the IC device on the slug.

9 Claims, 4 Drawing Sheets

THERMALLY ENHANCED METAL CAPPED BGA PACKAGE

This application is a divisional of application Ser. No. 10/068,523, filed Feb. 5, 2002 now U.S. Pat. No. 6,882,041 which is incorporated herein in its entirety.

BRIEF DESCRIPTION OF THE INVENTION

This invention relates to glob top ball-grid array ("BGA") electronic packages that are thermally enhanced to accommodate higher powered integrated circuit ("IC") devices, a.k.a. chips.

BACKGROUND OF THE INVENTION

Among the variety of electronic packages used in the electronics industry, glob top BGA packages are one of the popular packages for low-end performance applications. Glob top BGA packages are part of a large family of wirebond BGA packages. These wirebond BGA packages utilize low-cost organic material based substrates (a.k.a. laminates) such as Bismaleimide triazine epoxy ("BT"), polyimide, and polytetrafluoroethylene, and are well-suited for the low-end performance applications because of their relatively low cost.

FIG. 1 illustrates a cross-sectional view of such a prior art glob top BGA package. The package consists of a laminate substrate 10 having on one side BGA solder balls 20 and on the opposite side a die attach pad ("DAP") 14 for receiving an IC device (a.k.a. a die) 30. DAP 14 is typically surrounded by metallized wirebond pads 12 on laminate substrate 10 to which wirebond wires 34 can be bonded.

An IC device 30 is attached to DAP 14 using thermally conductive epoxy 32 with its active side facing away from laminate substrate 10. Wirebond wires 34 make the electrical interconnection between IC device 30 and metallized pads 12 on laminate substrate 10. One end of each wirebond wire 34 is bonded to a wirebond pad (not shown) on the IC device and the other end of the wire is bonded to a pad 12. The side of laminate substrate 10 where IC device 30 is attached is then encapsulated with glob top epoxy 40 which is dispensed in sufficient amount to cover IC device 30 and wirebond wires 34. Glob top epoxy 40 is dispensed in a liquid state and then cured. Glob top epoxy 40 protects IC device 30 and wirebond wires 34 against corrosion and mechanical damage.

Although these prior art wirebond BGA packages have relatively poor cooling capability, they have been adequate because IC devices used in low-end performance applications have been relatively low powered. Typical power dissipation of IC devices used in this performance segment up to now has been about 3 Watts.

With ever-increasing integration of the IC devices driven by the demand for higher performance, IC devices at all levels of application have been incorporating more circuits per unit area. With every new generation of IC devices, this development has resulted in increases in both the performance and the power output of each device This trend has also resulted in the utilization of higher performing and higher powered IC devices in the low-cost application segment where glob top BGA packages are commonly used. Therefore, there is a need for low-cost wirebond BGA packages with improved cooling capabilities that can accommodate IC devices with greater than 3 Watts of power dissipation.

SUMMARY OF THE INVENTION

The present invention provides a thermally enhanced wirebond BGA package. A substrate having two sides is provided on which an IC device is attached to one side. A metal cap having a side wall portion and a top portion is attached to the substrate along peripheral portion of substrate so that the cap forms an internal cavity enclosing the IC device. The cap has one or more holes in the top portion. The internal cavity is filled with an epoxy encapsulant material filling a substantial portion of the internal cavity, wherein the epoxy encapsulant material is in contact with both said IC device and the top portion of the metal cap.

The epoxy encapsulant material provides a thermal conduction path between the IC device and the metal cap to improve the package's ability to cool the IC device. Also in a preferred embodiment, the thermal conductivity of the epoxy encapsulant material is enhanced by dispersing high thermal conductivity particles in the epoxy encapsulant material. The high thermal conductivity particles are preferably also electrical insulators so that a separate electrical insulation between the IC device and the metal cap is not required.

Another embodiment of the present invention may incorporate a metal heat slug that is provided between the IC device and the laminate substrate to further enhance the thermal performance of the wirebond BGA package. The metal heat slug has a DAP portion, preferably at least one wirebond pad window portion, and a peripheral rim portion. The metal heat slug is bonded to the top surface of the laminate substrate and the IC device is attached to the DAP portion of the metal heat slug. The metal heat slug may extend out to the peripheral edge portion of the laminate substrate so that the metal cap is attached to the peripheral rim portion of the metal heat slug. In this configuration, the metal heat slug functions as a heat spreader for the IC device and further enhances the thermal performance of the wirebond BGA package by providing a second thermal conduction path between the IC device and the metal cap through the metal heat slug. The metal heat slug is preferably made of a metal or metal alloy having relatively high thermal conductivity such as copper, aluminum or alloys thereof. The metal heat slug may be made of a material with sufficient stiffness so that substrate warping problem sometimes observed after the epoxy encapsulant cure process is minimized.

The present invention also includes a method of forming a wirebond BGA package whose structures are disclosed herein. The involved process steps may include: providing a substrate having two sides; attaching a metal heat slug to one of the two sides where the metal heat slug is provided with a die attach pad portion, at least one wirebond pad window portion, and peripheral rim portions; attaching an integrated circuit device to the die attach pad portion; attaching a metal cap to the metal heat slug along the peripheral rim portions forming an internal cavity between the metal cap and the substrate; and filling a substantial portion of the internal cavity with an epoxy encapsulant material.

DESCRIPTION OF THE DRAWINGS

For a better understanding of the invention, reference should be made to the following detailed description taken in conjunction with the accompanying drawings, in which.

DETAILED DESCRIPTION OF THE INVENTION

Figure 2:
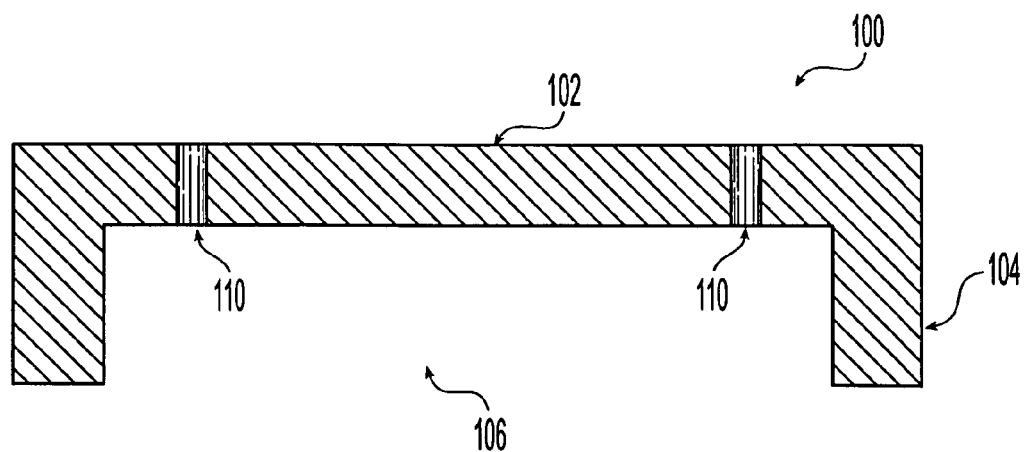
FIG. 2 is a cross-sectional view of a metal cap according to the present invention.

FIG. 2 illustrates a cross-sectional view of a metal cap 100 according to the present invention. Metal cap 100 has a sidewall portion 104 and a top portion 102 that form an internal cavity 106. Metal cap 100 also has a plurality of holes 110 in top portion 102. Metal cap 100 may be made from metal or metal alloys having relatively high thermal conductivity such as copper, aluminum, or alloys thereof.

Figure 3:
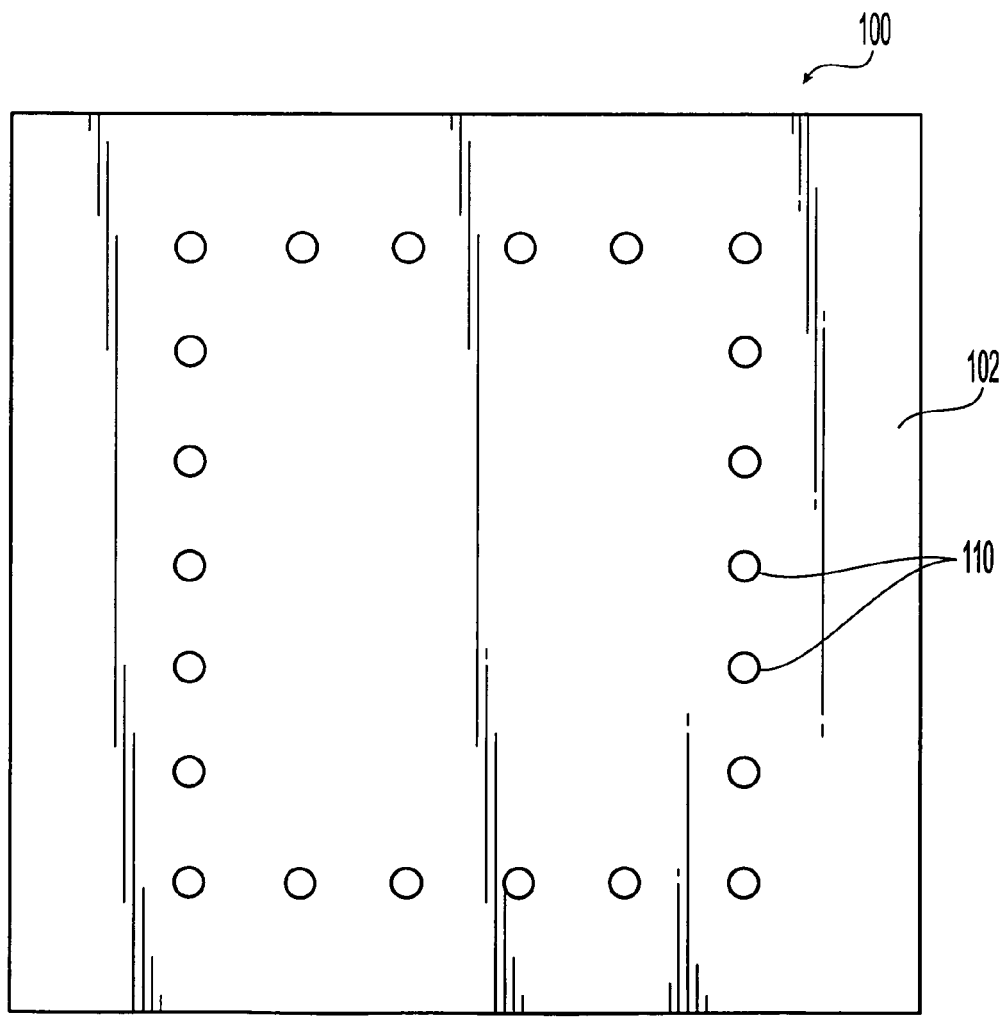
FIG. 3 is a top view of the metal cap of FIG. 2.

FIG. 3 illustrates a top view of metal cap 100 showing a plurality of holes 110. Metal cap 100 is shown as having a square outline. This particular shape is for illustrative purposes only and the particular outline shape and dimension of a given metal cap would be determined by the particular shape of the laminate substrate to which the given metal cap will be attached.

Figure 4:
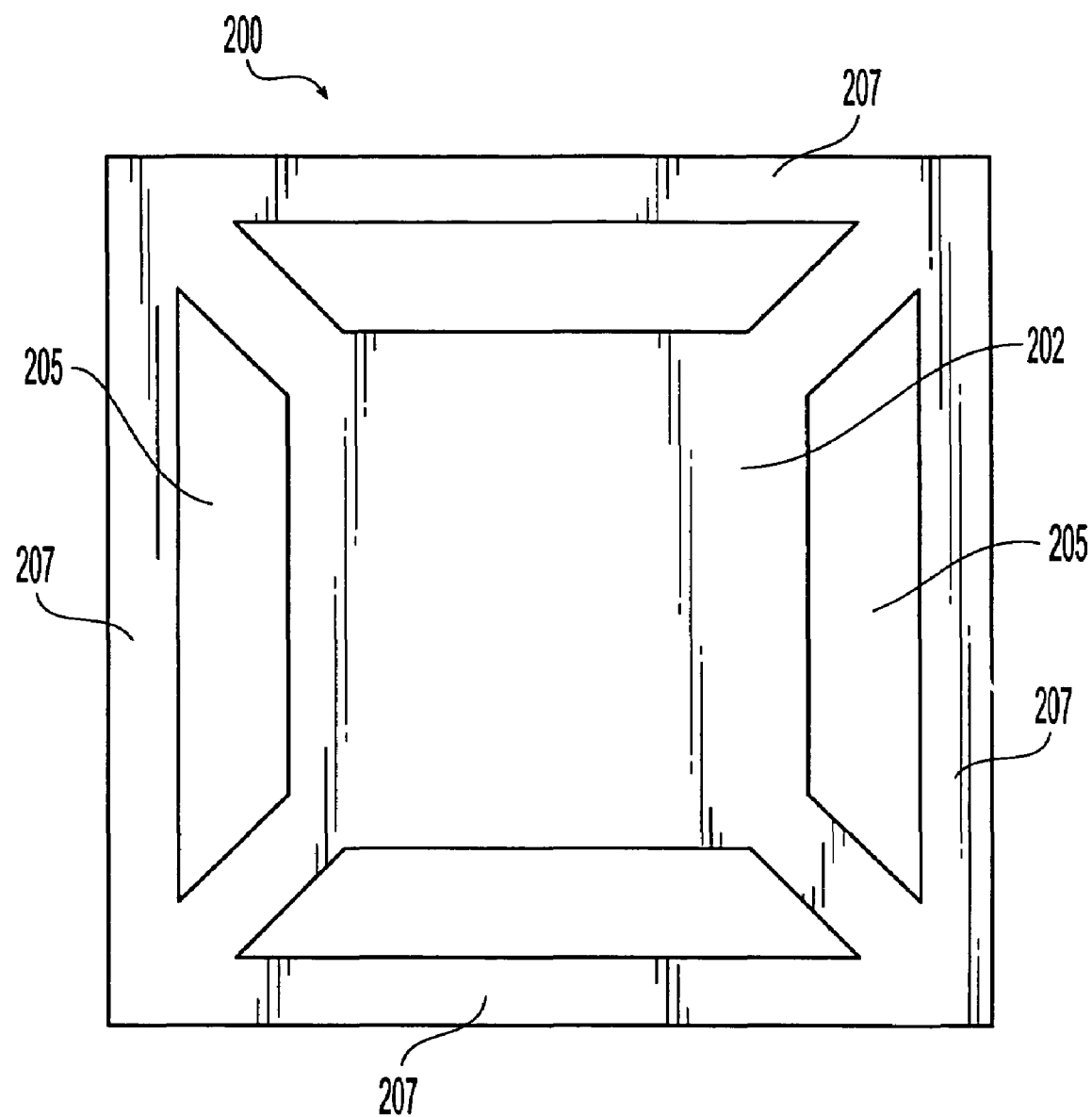
FIG. 4 is an illustration of a metal heat slug that may be used in conjunction with the metal cap of FIG. 2 to further enhance the thermal performance of a BGA electronic package according to the present invention.

FIG. 4 illustrates a top view of a metal heat slug 200 according to an embodiment of the present invention. Metal heat slug 200 has a DAP portion 202 where an IC device would be attached. Along the edge of metal heat slug 200 are peripheral rim portions 207. Between DAP portion 202 and peripheral rim portions 207 is at least one wirebond pad window portion 205 that provides clearance for wirebond pads 312 (see FIG. 3) when metal heat slug 200 is attached to the top surface of a laminate substrate. Metal heat slug 200 may be made of metal or metal alloy sheets having relatively high thermal conductivity such as copper, aluminum, or alloys thereof.

Figure 5:
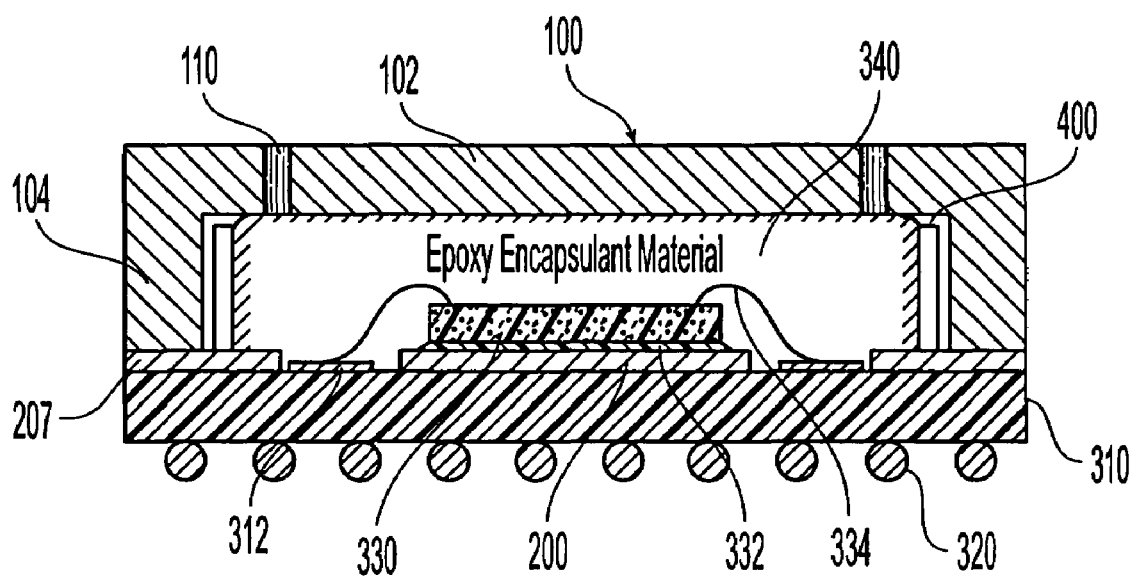
FIG. 5 is a schematic cross-section of an embodiment of a wirebond BGA package according to the present invention.

An embodiment of a wirebond BGA package fully assembled according to an embodiment of the present invention is illustrated in FIG. 5. A laminate substrate 310 is illustrated as having BGA solder balls 320 on its bottom side. A metal heat slug 200 is bonded to the top surface of the laminate substrate. An epoxy adhesive may be used to bond the metal heat slug to the laminate substrate. As illustrated, wirebond pads 312 sit within wirebond finger window 205 (see FIG. 4) without interfering with metal heat slug 200. An IC device 330 is attached to DAP portion 202 (see FIG. 4) of metal heat slug 200. The IC device is typically and preferably attached to DAP portion 202 using a thermally conductive epoxy 332. Wirebond wires 334 provide the electrical interconnection between the IC device and wirebond pads 312.

Figure 1:
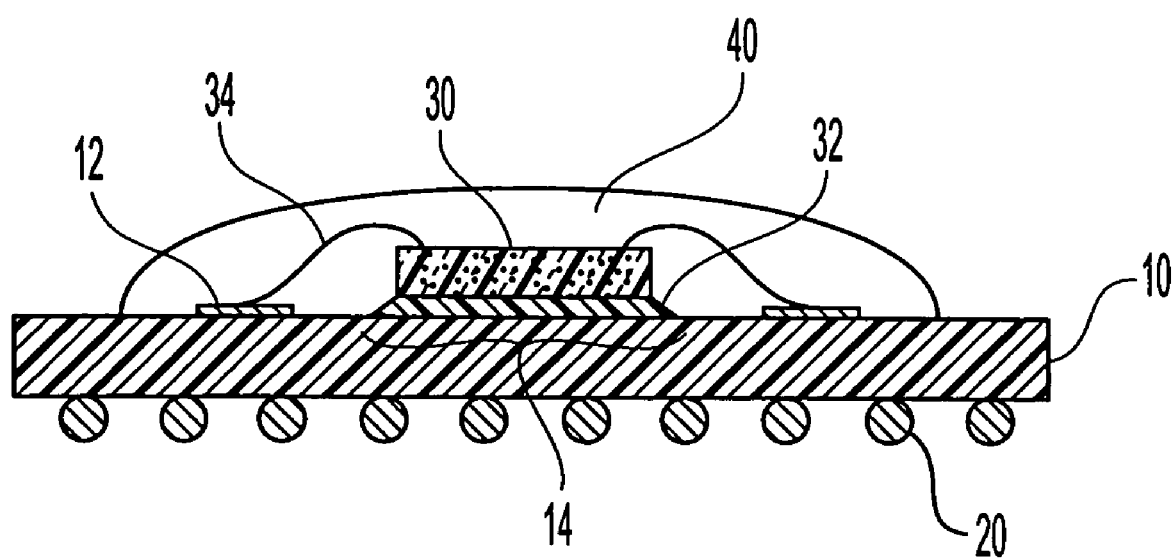
FIG. 1 is a schematic cross-section of a prior art glob top BGA package.

Metal cap 100 having a side wall portion 104 and a top portion 102 is then attached to metal heat slug 200 along peripheral rim portions 207. The resulting internal cavity formed between metal cap 100 and laminate substrate 310 is then filled with epoxy encapsulant material 340. Epoxy encapsulant material 340 may be dispensed into the internal cavity through one or more holes 110 provided in top portion 102 of metal cap 100. Epoxy encapsulant material 340 is dispensed in an uncured liquid form and then cured by heating the whole package assembly to a cure temperature of about 150-175 deg. C. Other holes 110 provide escape paths for gases produced by outgassing of epoxy encapsulant material 340 during the curing process. Epoxy encapsulant material 340 may be the same material as glob top epoxy 40 (see FIG. 1) typically used in prior art wirebond BGA packages. After the epoxy encapsulant is cured, warping of the laminate substrate may be observed in some BGA packages but this problem may be minimized by selecting a metal heat slug 200 having a sufficient stiffness. In another embodiment of the invention, metal heat slug 200 may not be included and metal cap 100 is attached directly onto the laminate substrate 310.

In another embodiment, the thermal conductivity of epoxy encapsulant material 340 may be enhanced by dispersing high thermal conductivity particles in the epoxy encapsulant material. A preferred material for the high thermal conductivity particles is diamond powder, cubic boron nitride, oxides such as alumina, or other materials having high thermal conductivity. Preferably, these high thermal conductivity particles are also electrical insulators so that a separate electrical insulation is not required between the IC device and the metal cap. An example of such thermally enhanced epoxy encapsulant material is Hysol FP4450 encapsulant marketed by Dexter Corporation of Industry, Calif. Hysol FP4450 is enhanced with diamond powder (15% by weight). The thermal conductivity of this enhanced encapsulant is about 2.8 W/MK. In comparison, the thermal conductivity of a conventional glob top epoxy found in prior art wirebond BGA packages is about 0.8-0.7 W/MK.

In this configuration of the wirebond BGA package, at least two primary thermal conduction paths are established between IC device 330 and metal cap 100. A first thermal conduction path is established through epoxy encapsulant material 340 and a second thermal conduction path is established through metal heat slug 200. In this configuration, metal cap 100 functions as a heat sink that dissipates the heat from IC device 330 that has been conducted to metal cap 100 via the thermal conduction paths described above.

Additionally, FIG. 5 also illustrates a feature of another embodiment of the invention, where a retaining ring 400 may be attached to metal heat slug 200 along peripheral rim portion of the metal heat slug. In this embodiment, retainer ring 400 is attached to metal heat slug 200 before the metal cap attachment. Retainer ring 400 may be attached to metal heat slug 200 using a suitable adhesive such as an epoxy adhesive or other adhesive materials or means. Next, a first dose of an epoxy encapsulant material 340 is dispensed into the center of retainer ring 400 covering IC device 300 until the encapsulant material reaches the top edge of the retainer ring. After epoxy encapsulant material 340 is cured, a metal cap 100 is attached to laminate substrate 310. Retainer ring 400 acts as a dam around IC device 300 to control the height of the first dose of epoxy encapsulant material 340 so that when metal cap 100 is attached, the top surface of the epoxy encapsulant material 340 comes in close proximity to the inside surface of metal cap 100 forming a small gap between the metal cap and the first dose of the epoxy encapsulant material.

Next, a second dose of epoxy encapsulant material 340 is applied through the one or more holes 110 in the top portion of metal cap 100 to fill the gap between the metal cap and the first dose of, now cured, epoxy encapsulant material 340. The BGA package then goes through a second epoxy cure process to cure the second dose of epoxy encapsulant material 340. The result is that the space between IC device 330 and metal cap 100 is substantially filled with epoxy encapsulant material 340 providing a thermal conduction path between IC device 330 and metal cap 100.

A wirebond BGA package configured as illustrated in FIG. 5, and discussed above, is able to accommodate IC devices dissipating greater than 3 Watts of power. The applicants have successfully assembled a wirebond BGA package according to an embodiment of the invention and demonstrated that a 5 Watt IC device can be maintained at a maximum IC device junction temperature of 125 deg. C. in a natural convection environment having maximum ambient temperature of 70 deg. C. These are the same thermal performance parameters met by the prior art glob top BGA package of FIG. 1, carrying a 3 Watt IC device. In this embodiment of the invention, the wirebond BGA package was provided with a laminate substrate having X-Y dimensions of 23 mm×23 mm and a thickness of 0.56 mm. The metal cap was made of anodized aluminum having a thickness of 0.25 mm and its dimensions were 23 mm×23 mm×0.9 mm. The metal heat slug was made of a copper sheet having a thickness of 0.25 mm and had X-Y dimensions of 23 mm×23 mm. The IC device had X-Y dimensions of 1.0 cm×1.0 cm.

It will be appreciated to one skilled in the art that the illustrative discussions above are not intended to be exhaustive or to limit the invention to the precise embodiments disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A method of forming a ball-grid array package, comprising:
    providing a substrate having first and second sides;
    mounting an integrated circuit device on said substrate;
    attaching a metal cap having a said wall portion and a top portion to said substrate along peripheral rim portions of said substrate forming an internal cavity between said metal cap and said substrate so that said integrated circuit device is within said internal cavity; and
    filling through at least one hole in said top portion of said metal cap a substantial portion of said internal cavity with an epoxy encapsulant material so that said epoxy encapsulant material comes in contact with both said integrated circuit device and said top portion of said metal cap.

2. A method of forming a ball-grid array package according to claim 1, further comprising dispersing thermally conductive particles in said epoxy encapsulant material.

3. A method of forming a ball-grid array package according to claim 2 wherein said thermally conductive particles are made from a material selected from one of diamond, cubic boron or an oxide such as alumina.

4. A method of forming a ball-grid array package comprising:
    providing a substrate having first and second sides;
    attaching a metal heat slug to said first side of said substrate; said metal heat slug having a die attach pad portion, at least one wirebond pad window portion, and peripheral rim portions;
    mounting an integrated circuit device to said die attach pad portion of said metal heat slug;
    attaching a metal cap having a side wall portion and a top portion to said metal heat slug along said peripheral rim portion of said metal heat slug forming an internal cavity between said metal cap and said substrate so that said integrated circuit device is within said internal cavity; and
    filling through at least one hole in said top portion of said metal cap a substantial portion of said internal cavity with an epoxy encapsulant material so that said epoxy encapsulant material comes in contact with both said integrated circuit device and said top portion of said metal cap.

5. A method of forming a ball-grid array package according to claim 4, further comprising dispersing thermally conductive particles in said epoxy encapsulant material.

6. A method of forming a ball-grid array package according to claim 5 wherein said thermally conductive particles are made from a material selected from one of diamond, cubic boron nitride or an oxide such as alumina.

7. A method of forming a ball-grid array package comprising:
    providing a substrate having first and second sides;
    attaching a metal heat slug to said first side of said substrate, said metal heat slug having a die attach pad portion, at least one wirebond pad window portion, and peripheral rim portions;
    mounting an integrated circuit device to said attach pad portion of said metal heat slug;
    attaching a retainer ring to said metal heat slug so that said integrated circuit device is within said retainer ring;
    dispensing a first dose of an epoxy encapsulant material over said integrated circuit device within said retainer ring;
    curing said first dose of an epoxy encapsulant material;
    attaching a metal cap having a side wall portion and a top portion to said metal heat slug along said peripheral rim portions of said metal heat slug forming an internal cavity between said metal cap and said substrate so that said integrated circuit device is within said internal cavity and a small gap is formed between an inside surface of said top portion of said metal cap and said first dose of an epoxy encapsulant material; and
    filling a substantial portion of said small gap with a second dose of an epoxy encapsulant material through at least one hole in said top portion of said metal cap whereby the second dose of an epoxy encapsulant material is in contact with said integrated circuit device and said top portion of said metal cap.

8. A method of forming a ball-grid array package according to claim 7, further comprising dispersing thermally conductive particles in said epoxy encapsulant material.

9. A method of forming a ball-grid array package according to claim 7 wherein said thermally conductive particles are made from a material selected from one of diamond, cubic boron nitride or an oxide such as alumina.

* * * * *